United States Patent
Suzuki

(10) Patent No.: US 7,482,847 B2
(45) Date of Patent: Jan. 27, 2009

(54) POWER-ON RESET CIRCUIT

(75) Inventor: Koji Suzuki, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 646 days.

(21) Appl. No.: 10/396,811

(22) Filed: Mar. 26, 2003

(65) Prior Publication Data

US 2004/0066218 A1 Apr. 8, 2004

(30) Foreign Application Priority Data

Oct. 3, 2002 (JP) ............................. 2002-291117

(51) Int. Cl.
*H03L 7/00* (2006.01)
(52) U.S. Cl. ..................... 327/143; 327/198
(58) Field of Classification Search ............... 327/143, 327/198
See application file for complete search history.

(56) References Cited

U.S. PATENT DOCUMENTS

| | | | |
|---|---|---|---|
| 5,187,389 A * | 2/1993 | Hall et al. ...................... 327/50 |
| 5,485,111 A | 1/1996 | Tanimoto |
| 5,512,849 A * | 4/1996 | Wong ........................... 327/77 |
| 5,528,182 A * | 6/1996 | Yokosawa .................... 327/143 |
| 5,930,129 A | 7/1999 | Sugimura |
| 6,144,237 A | 11/2000 | Ikezaki |
| 6,346,834 B1 | 2/2002 | Chai |
| 6,437,614 B1 * | 8/2002 | Chen ........................... 327/143 |
| 6,469,552 B2 | 10/2002 | Ohbayashi et al. |
| 6,492,850 B2 * | 12/2002 | Kato et al. .................... 327/143 |
| 6,586,975 B2 * | 7/2003 | Nagaya et al. ............... 327/143 |
| 2002/0043994 A1 * | 4/2002 | Bando et al. ................. 327/143 |
| 2003/0058012 A1 * | 3/2003 | Matsushita ................... 327/143 |
| 2003/0098728 A1 * | 5/2003 | Nagaya et al. ............... 327/143 |

FOREIGN PATENT DOCUMENTS

| | | |
|---|---|---|
| JP | 6-29807 | 2/1994 |
| JP | 7-240677 | 9/1995 |
| JP | 10-313240 | 11/1998 |
| JP | 11-68539 | 3/1999 |
| JP | 2001-16085 | 1/2001 |

* cited by examiner

*Primary Examiner*—Lincoln Donovan
*Assistant Examiner*—William Hernandez
(74) *Attorney, Agent, or Firm*—Rabin & Berdo, P.C.

(57) ABSTRACT

The invention provides a power-on reset circuit capable of outputting a reset signal again and reducing an influence exerted upon the reset signal caused by the variation in a manufacturing process when a power supply potential lowers. The power-on reset circuit comprises (a) a first transistor circuit comprising first transistors connected between first and second potentials and to which a first current flows depending on a voltage between these potentials, (b) a second transistor circuit comprising second transistors having an on resistance which is smaller than that of the first transistors and a resistor serially connected to the second transistors, said second transistors and the resistor being connected between the first and second potentials, to which a second current flows depending on a voltage between these potentials, and (c) an output circuit for outputting a reset signal when the first current is greater than the second current upon comparison between the first and second currents.

17 Claims, 2 Drawing Sheets

POWER-ON RESET CIRCUIT

FIELD OF THE INVENTION

The invention relates to a power-on reset circuit for setting a system of a semiconductor integrated circuit or the like to an initial state when power is applied to the system.

BACKGROUND OF THE INVENTION

There has been conventionally widely used, as a power-on reset circuit, a type of the power-on reset circuit for applying a power supply voltage to a capacitor via a resistor, thereby generating a reset signal utilizing a charging time of the capacitor. However, there arises an inconvenience in such a power-on reset circuit that if the rising speed of the power supply voltage, when the power is applied thereto, is slower than the charging time of the capacitor, the output of the reset signal is stopped even when the power supply voltage is, e.g. less than 1V, so that an efficient rest signal can not be outputted. To avoid such an inconvenience, there is proposed, a power-on reset circuit, e.g. as disclosed in JP-A H11-68539. FIG. 1 shows a circuit diagram of a conventional power-on reset circuit as disclosed in this publication.

This power-on reset circuit comprises a power supply voltage detection circuit 60, a capacitor charging time constant circuit 70 and an inverter 75 serving as an output circuit. The power supply voltage detection circuit 60 comprises a PMOS 61 a source of which is connected to a power supply potential VCC, and a PMOSs 62 and 63 forming rectifying devices which are serially connected between a drain of the PMOS 61 and a ground potential GND. The drain of the PMOS 61 is connected to a node N60 to which a source of the PMOS 62 is connected. A gate and a drain of the PMOS 62 are connected to a source of the PMOS 63, and a gate and a drain of the PMOS 63 are connected to the ground potential GND.

The capacitor charging time constant circuit 70 comprises a PMOS 71 a gate of which is connected to the node N60, and a PMOS 72 a gate of which is connected to the power supply potential VCC. A source of the 71 is connected to the power supply potential VCC and a drain of the PMOS 72 is connected to the ground potential GND. A drain of the 71 and a source of the PMOS 72 are connected to a node N70 to which the gate of the PMOS 61 is connected. Further, a capacitor 73 is connected between the node N70 and the ground potential GND. A potential of the node N70 is converted into a detail signal of "H" and "L" by the inverter 75, and outputted as a reset signal.

An operation of the power-on reset circuit is described next.

When the power supply potential VCC is 0V which is the same as the ground potential GND, the PMOS 72 is in a diode connection state whereby an electric charge charged in the capacitor 73 is discharged through the PMOS 72. Consequently, the potential of the node N70 becomes less than a threshold voltage of the PMOS 72 which is applied to the gate of the PMOS 61 as a feedback voltage.

If the power supply potential VCC rises from this state, the inverter 75 outputs "H" but the potential thereof rises together with the power supply potential VCC. When the power supply potential VCC is greater than a sum of the threshold voltage of the PMOS 72 and that of the PMOS 61, the PMOS 72 is in an OFF state and the PMOS 61 is in an ON possible state.

Supposing that the sum of the threshold voltages PMOSs 62 and 63 is set to be greater than the sum of the threshold voltages of the PMOSs 61 and 72, the potential of the node N60 remains in a state where it is clamped by the diode voltages of two PMOSs 62 and 63 connected to the node N60. That is, each of the PMOSs 62 and 63 is not turned on while the potential of node N60 becomes a potential which is substantially proportional to the rise of the power supply potential VCC. This state continues during a period starting from the time when the power supply potential VCC reaches the sum of the threshold voltages of the PMOSs 61 and 72 and ending at the time when exceeds the sum of the threshold voltages of the PMOSs 62 and 63. As a result, the potential of the gate of the PMOS 71 is substantially the same as the power supply potential VCC, and is maintained in an OFF state.

When the power supply potential VCC further rises and exceeds the sum of the threshold voltages of the PMOSs 62 and 63, these PMOSs 62 and 63 are turned on so that a current flows to the PMOS 61. As a result, a voltage applied between the source and the gate of the PMOS 71. Still further, when the power supply potential VCC rises to exceed the sum of the threshold voltages of the PMOSs 62, 63 and 71, the PMOS 71 is completely turned on.

When the PMOS 71 is turned on, the charging of the capacitor 73 starts whereby the potential of node N70 rises by the time constant which is determined by an on resistance of the PMOS 71 and a capacitance of the capacitor 73. When the potential of the node N70 reaches the threshold voltage of the inverter 75, a reset signal outputted from the inverter 75 is changed from "H" to "L". As a result, the one shot reset signal outputted from the inverter 75 is cancelled.

When the potential of the node N70 further rises as the charging of the capacitor 73 advances, the potential of the gate of the PMOS 61 rises so that a voltage between the gate and source of the PMOS 61 becomes small and the PMOS 61 is turned off ultimately. When the PMOS 61 turned off, the potential of node N60 also lowers so that the PMOS 71 is also turned off to keep the level of the node N70 at "H".

Inasmuch as the power-on reset circuit is configured such that the charging of the capacitor 73 inside the capacitor charging time constant circuit 70 is started when the power supply potential VCC exceeds the sum of the threshold voltages of the PMOSs 62, 63 and 71 which is detected by the power supply voltage detection circuit 60, a reset signal can be surely generated even if the rising of the power supply potential VCC is slow.

However, there are following problems in the conventional power-on reset circuit. That is, if the reset signal is once cancelled when the power supply potential VCC rises, the reset signal is not outputted again unless the power supply potential VCC sufficiently lowers to discharge the electric charge of the capacitor 73 even if the power supply potential VCC lowers thereafter. Accordingly, in a case where the power supply potential VCC does not rise monotonously but rises un-monotonously while rising and lowering, there is a likelihood that an efficient reset signal can not be outputted.

Further, since the timing of the start of the charging of the capacitor 73 is determined by the threshold voltages of the PMOSs 62, 63 and 71, there is a problem that a cancellation voltages of the reset signal undergoes a lot of changes by the variation in a manufacturing process of the power-on reset circuit.

SUMMARY OF THE INVENTION

The invention provides a power-on reset circuit capable of outputting a reset signal again when a power supply potential lowers and reducing an influence exerted upon the reset signal caused by the variation in a manufacturing process. The power-on reset circuit comprises (a) a first transistor circuit comprising first transistors connected between first and second potentials and to which a first current flows depending on a voltage between these potentials, (b) a second transistor circuit comprising second transistors having an on resistance which is smaller than that of the first transistors and a resistor serially connected to the second transistors, said second transistors and the resistor being connected between the first and second potentials, to which a second current flows depending on a voltage between these potentials, and (c) an output circuit for outputting a reset signal when the first current is greater than the second current upon comparison between the first and second currents.

DETAILED DESCRIPTION OF THE PREFERRED EMBODIMENT

Figure 1:
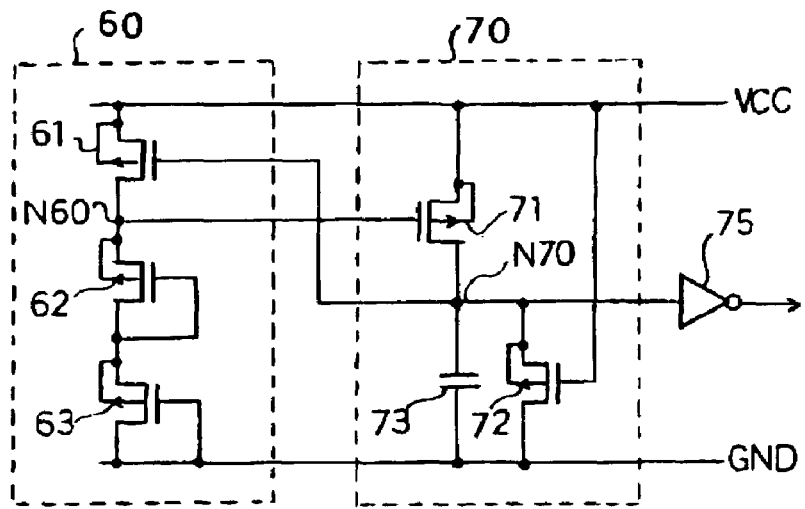
FIG. 1 is a circuit diagram of a conventional power-on reset circuit.
Figure 2:
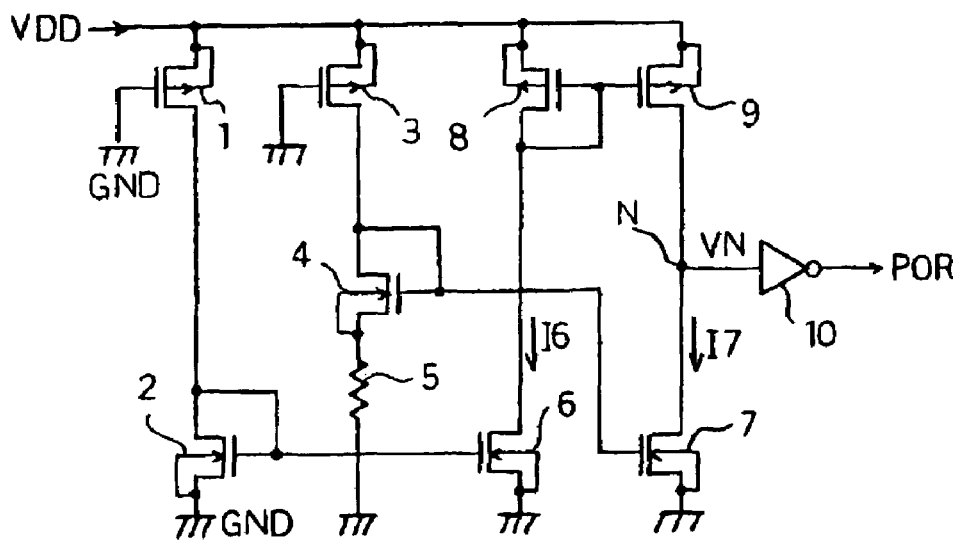
FIG. 2 is a circuit diagram of a power-on reset circuit according to a preferred embodiment of the invention.

FIG. 2 is a circuit diagram of a power-on reset circuit according to a preferred embodiment of the invention. The power-on reset circuit comprises first and second transistor circuits to which first and second currents flow respectively depending on a power supply potential VDD, and an output circuit for outputting a reset signal based on the first and second currents.

The first transistor circuit is configured by, e.g., a PMOS 1 and an NMOS 2, wherein a source of the PMOS 1 is connected to the power supply potential VDD and a gate thereof is connected to a ground potential GND. A drain of the PMOS 1 is connected to a drain and a gate of the NMOS 2, and a source of the NMOS 2 is connected to the ground potential GND.

The second transistor circuit is configured by, e.g., a PMOS 3, an NMOS 4 and a resistor 5, wherein a source of the PMOS 3 is connected to the power supply potential VDD and a gate thereof is connected to a ground potential GND. A drain of the PMOS 3 is connected to a drain and a gate of the NMOS 4, and a source of the NMOS 4 is connected to the ground potential GND via the resistor 5.

Dimensions (=gate width W/gate length L) of the PMOSs 1 and 3 are set to the same value. Further, dimensions of the NMOS 4 are set to be larger than those of the NMOS 2 (e.g., by ten times). The dimensions of the transistors correspond to a driving performance of the transistor wherein the greater the value is, the smaller the on resistance is, thereby rendering the current supply performance large.

The output circuit comprises NMOSs 6 and 7 and PMOSs 8 and 9 wherein gates of the NMOSs 6 and 7 are connected to the gates of the NMOS 2 and 4 to form a current mirror circuit. Sources of the NMOSs 6 and 7 are connected to the ground potential GND and drains of the NMOSs 6 and 7 are connected to the power supply potential VDD via the PMOSs 8 and 9. Further, gates of the PMOSs 8 and 9 are connected to a drain of the PMOS 8. The dimensions of NMOSs 6 and 7 and those of the PMOSs 8 and 9 are set to the same values.

An inverter 10 which is driven by the power supply potential VDD is connected to a node N serving as a junction to which drains of the NMOS 7 and PMOS 9 are connected, and a reset signal POR is outputted from an output side of the inverter 10.

Figure 3A:
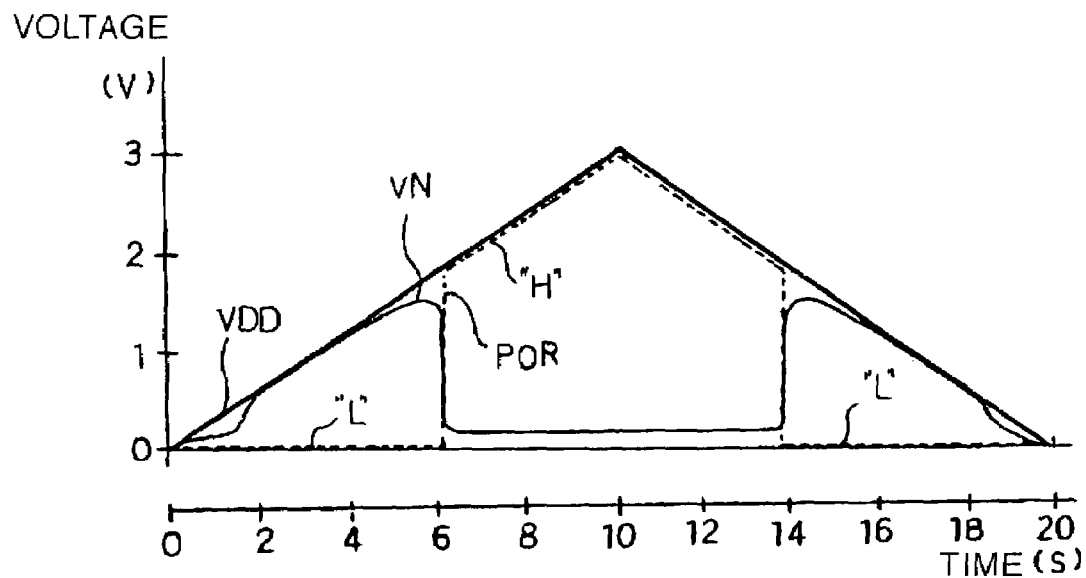
FIGS. 3(A) and 3(B) are graphs showing waveforms representing voltage current characteristics of the power-on reset circuit in FIG. 2 when operated.
Figure 3B:
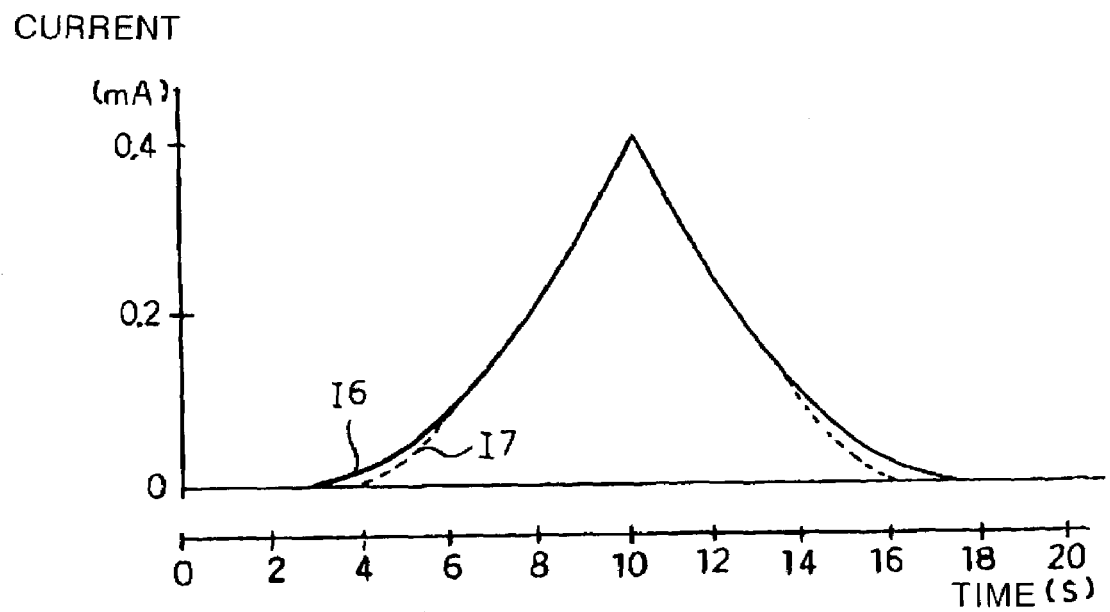

FIGS. 3(A) and 3(B) are graphs showing an operation of waveforms representing voltage current characteristics of the power-on reset circuit in FIG. 2 when operated. These figures show voltage waveforms of the power supply potential VDD, a potential VN of the node N and the reset signal POR in cases where the power supply potential VDD linearly rises from 0V to 3V for ten seconds and linearly lowers to 0V again for another ten seconds, and current waveforms of currents 16, 17 flowing to the NMOSs 6 and 7.

When the power supply potential VDD gradually rises from 0V and exceeds the threshold voltages of the MOS transistors, the PMOSs 1 and 3 are rendered in ON state so that the current flows to the NMOSs 2 and 4. As a result, the current also flows to the NMOSs 6 and 7 forming the current mirror circuit. During a period when the power supply potential VDD is low, a current flows to the NMOS 4 is smaller than that flowing to the NMOS 2 owing to the influence of the resistor 5 interposed between the NMOS 4 and the ground potential GND.

Since the NMOSs 6 and 7 forming the current mirror circuit are connected to the NMOS 2 and NMOS 4, the current 17 flowing to the NMOS 7 becomes smaller than the current 16 flowing to the NMOS 6. Since the dimensions of the PMOSs 8 and 9 are set to the same value, the current flowing to the NMOS 6 is substantially the same as that flowing to the PMOS 9. As a result, the current flowing to the NMOS 9 becomes larger than that flowing to the PMOS 7 so that the potential VN of the node N becomes the same as the power supply potential VDD. Accordingly, the reset signal POR becomes "L" so that a reset signal (state) is outputted.

As the power supply potential VDD rises, there appears the influence caused by the difference between the dimensions (on resistance) of the NMOS 2 and NMOS 4, so that the current 17 flowing to the NMOS 7 sharply rises compared with the current 16 flowing to the NMOS 6. When the power supply potential VDD reaches to a certain potential, the currents 16 and 17 become equal to each other. When the power supply potential VDD further rises, the current 17 becomes larger than the current 16. As a result, the potential VN of the node N is inverted from the power supply potential VDD to the ground potential GND so that the reset signal POR becomes "H", canceling a reset state.

Although the power supply potential VDD rises to the 3V thereafter, the reset signal POR is not changed while remaining "H" since the state where the current 17 is larger than the current 16 continues.

Next, when the power supply potential VDD gradually lowers from 3V, the potential VN of the node N becomes the ground potential GND during a period when the current 17 is larger than the current 16, and the reset signal POR is not changed while remaining "H".

When the power supply potential VDD further lowers to reverse the relation between the current 16 and the current 17, the current 16 becomes larger than the current 17 so that the potential VN of the node N is inverted to the power supply potential VDD. As a result, the reset signal POR is inverted again to become "L" to output a reset signal (state).

At the time when the magnitude of the current 16 and the current 17 is inverted as the power supply potential VDD rises or lowers, the power supply potential VDD is determined by a ratio of dimensions between the NMOS 2 and the NMOS 4 and the value of the resistor 5, and is not related with the speed of change of the power supply potential VDD.

In such a manner, the power-on reset circuit of the preferred embodiment comprises the NMOS 2 to which a current flows depending on the power supply potential VDD and the NMOS 4 having greater dimensions than NMOS 2, and a current flows to the NMOS 4 depending on the power supply potential VDD via the serially connected resistor 5, wherein the reset signal POR is outputted based on the result of comparison between the currents flowing to the NMOSs 2 and 4. As a result, the reset signal POR can be outputted again when the power supply potential VDD lowers even after the reset state is cancelled upon completion of the application of the power.

Further since the NMOSs 6 and 7 are formed by the same process, the influence caused by the variation in the process can be offset, thereby obtaining an advantage that the power-on reset circuit having less influence upon the reset signal caused by the variation in the manufacturing process.

The invention is not limited to the foregoing preferred embodiment but can be modified variously. There are exemplified as follows as modifications of the invention.

(a) A resistor or a diode may be employed instead of the PMOSs 1 and 3.

(b) The power-on reset circuit may configured such that the PMOS and NMOS are replaced with each other and the power supply potential VDD and the ground potential GND are replaced with each other.

(c) Although the dimensions of the NMOS 4 are set to be greater than those of the NMOS 2, the NMOS 4 may be configured such that transistors each having the same size as the NMOS 2 may be connected in parallel with one another.

According to the invention, as described in detail, the power-on reset circuit comprises the first transistors to which the first current flows depending on a voltage between the potentials, the second transistors which are larger than the first transistors in dimensions and the resistor is connected in series thereto, and the output circuit for outputting the reset signal when the first current is larger than the second current upon comparison between the first and second currents. As a result, the reset signal can be outputted again even if the power supply potential lowers when the power is applied thereto.

What is claimed is:

1. A power-on reset circuit, comprising:
  a first transistor circuit including a plurality of first transistors connected between first and second potential sources so as to form a first current path therethrough and to which a first current flows depending on a voltage between the potential sources;
  a second transistor circuit including a plurality of second transistors having an on resistance which is smaller than that of the first transistors and a resistor serially connected to the second transistors, the second transistors and the resistor being connected between the first and potential sources so as to form a second current path therethrough, to which a second current flows depending on a voltage between the potential sources; and
  an output circuit for outputting a reset signal when the first current is greater than the second current upon comparison between the first and second currents.

2. The power-on reset circuit according to claim 1, wherein the first transistors include a first conductive type first transistor having a source connected to the second potential source and a gate and a drain thereof connected to each other, and a second conductive type third transistor having a source and a gate connected to the first and second potential sources respectively, and a drain thereof connected to the drain of the first transistor;
  the second transistors include a first conductive type second transistor having a gate and a drain which are connected to each other, the resistor being connected between the source of the second transistor and the second potential source, and a second conductive type fourth transistor having a source and a gate connected to the first and second potential sources respectively, and a drain thereof connected to the drain of the second transistor; and
  the output circuit includes a first conductive type fifth transistor having a gate connected to the gate of the first transistor and a source connected to the second potential source, a first conductive type sixth transistor having a gate connected to the gate of the second transistor, a source connected to the second potential source, and a drain connected to a node for outputting the reset signal, a second conductive type seventh transistor having a source connected to the first potential source and a gate and a drain connected to the drain of the fifth transistor, and a second conductive type eighth transistor having a source connected to the first potential source, a gate connected to the drain of the fifth transistor and a drain connected to the node.

3. The power-on reset circuit according to the claim 2, wherein dimensions (gate width (W)/gate length (L)) of the third and forth transistors are set to the same value and dimensions of the second transistor are set to be greater than those of the first transistor.

4. The power-on reset circuit according to claim 2, wherein dimensions of the fifth and sixth transistors are set to be the same and dimensions of the seventh and eighth transistors are set to be the same.

5. A power-on reset circuit comprising:
  a first current generation circuit connected between first and second potential sources, the first current generation circuit providing a first current therethrough;
  a second current generation circuit connected between the first and second potential sources, the second current generation circuit providing a second current therethrough; and
  a current comparison circuit coupled to the first and second current generation circuits, the current comparison circuit having an output node and comparing the first and second currents so as to provide a voltage at the output node based on the current comparison,
  wherein the first current generation circuit includes a first transistor of a first conductive type having a source connected to the second potential source and a gate and a drain connected together, and a second transistor of a second conductive type having a source connected to the first potential source, a gate connected to the second potential source and a drain thereof connected to the drain of the first transistor, and
  wherein the second current generation circuit includes a third transistor of the first conductive type having a gate and a drain connected together and a source, a resistor connected between the source of the third transistor and the second potential source, and a fourth transistor of the second conductive type having a source connected to the first potential source, a gate connected to the second potential source and a drain connected to the drain of the second transistor.

6. A power-on reset circuit according to claim 5, wherein a dimension of the first transistor is smaller than that of the third transistor.

7. A power-on reset circuit according to claim 5, wherein a dimension of the second transistor is equal to that of the fourth transistor.

8. A power-on reset circuit according to claim 5, wherein the current comparison circuit includes:

a fifth transistor of the first conductive type having a source connected to the second potential source, a gate connected to the gate of the first transistor, and a drain;

a sixth transistor of the first conductive type having a source connected to the second potential source, a gate connected to the gate of the third transistor and a drain connected to the output node;

a seventh transistor of the second conductive type having a source connected to the first potential source and a gate and a drain connected to the drain of the fifth transistor; and an eighth transistor of the second conductive type having a source connected to the first potential source, a gate connected to the gate of the seventh transistor, and a drain connected to the output node.

9. A power-on reset circuit according to claim 8, wherein a dimension of the fifth transistor is equal to that of the sixth transistor.

10. A power-on reset circuit according to claim 8, wherein a dimension of the seventh transistor is equal to that of the eighth transistor.

11. A power-on reset circuit comprising:

a first current generation circuit connected between first and second potential sources, the first current generation circuit providing a first current therethrough, the first current generation circuit having a plurality of first transistors;

a second current generation circuit connected between the first and second potential sources, the second current generation circuit providing a second current therethrough, the second current generation circuit having a plurality of second transistors; and a current comparison circuit coupled to the first and second current generation circuits, the current comparison circuit having an output node, the current comparison circuit additionally having a plurality of third transistors including a pair of the third transistors providing a first current mirror circuit;

wherein one of the first transistors and one of the third transistors provides a second current mirror circuit; and wherein one of the second transistors and one of the third transistors provides a third current mirror circuit.

12. A power-on reset circuit according to claim 11, further comprising an output circuit connected to the output node.

13. A power-on reset circuit according to claim 12, wherein the output circuit is an inverter.

14. A power-on reset circuit according to claim 11, wherein the first transistors include a fourth transistor of a first conductive type having a source connected to the second potential source and a gate and a drain connected together, and a fifth transistor of a second conductive type having a source connected to the first potential source, a gate connected to the second potential source and a drain thereof connected to the drain of the fourth transistor, and wherein the second transistors include a sixth transistor of the first conductive type having a gate and a drain connected together and a source, a resistor connected between the source of the sixth transistor and the second potential source, and a seventh transistor of the second conductive type having a source connected to the first potential source, a gate connected to the second potential source and a drain connected to the drain of the sixth transistor.

15. A power-on reset circuit according to claim 14, wherein a dimension of the fourth transistor is smaller than that of the sixth transistor.

16. A power-on reset circuit according to claim 14, wherein a dimension of the fifth transistor is equal to that of the seventh transistor.

17. A power-on reset circuit according to claim 14, wherein the third transistors includes:

an eighth transistor of the first conductive type having a source connected to the second potential source, a gate connected to the gate of the fourth transistor and a drain;

a ninth transistor of the first conductive type having a source connected to the second potential source, a gate connected to the gate of the sixth transistor and a drain connected to the output node;

a tenth transistor of the second conductive type having a source connected to the first potential source and a gate and a drain connected to the drain of the eighth transistor; and an eleventh transistor of the second conductive type having a source connected to the first potential source, a gate connected to the gate of the tenth transistor and a drain connected to the output node.

* * * * *